US009254992B2

(12) United States Patent
Ju

(10) Patent No.: US 9,254,992 B2
(45) Date of Patent: Feb. 9, 2016

(54) METHOD OF MAKING A MEMS GYROSCOPE HAVING A MAGNETIC SOURCE AND A MAGNETIC SENSING MECHANISM

(71) Applicant: Tao Ju, Beijing (CN)

(72) Inventor: Tao Ju, Beijing (CN)

(73) Assignee: Tao Ju, Beijing (CN)

( * ) Notice: Subject to any disclaimer, the term of this patent is extended or adjusted under 35 U.S.C. 154(b) by 142 days.

(21) Appl. No.: 13/863,269

(22) Filed: Apr. 15, 2013

(65) Prior Publication Data
US 2014/0308757 A1 Oct. 16, 2014

(51) Int. Cl.
*B81C 3/00* (2006.01)
*B81B 3/00* (2006.01)
*G01C 19/56* (2012.01)
*H01L 29/82* (2006.01)
*G01P 15/105* (2006.01)

(52) U.S. Cl.
CPC .............. *B81B 3/0032* (2013.01); *G01C 19/56* (2013.01); *B81B 2201/0235* (2013.01); *B81B 2201/0242* (2013.01); *G01P 15/105* (2013.01); *H01L 29/82* (2013.01); *H01L 2924/1461* (2013.01)

(58) Field of Classification Search
CPC ............ H01L 2924/1461; H01L 29/82; H01L 41/0825; B81B 3/0032; B81B 2201/0235; B81B 2201/0242; G01C 19/56; G01P 15/105; H04N 5/23222; G06F 3/04842
USPC ........................................... 438/3; 73/504.12
See application file for complete search history.

(56) References Cited

U.S. PATENT DOCUMENTS

| | | | | |
|---|---|---|---|---|
| 3,867,844 A * | 2/1975 | Shimizu | ................ | G01P 15/11 73/514.31 |
| 4,967,598 A * | 11/1990 | Wakatsuki | .......... | G01P 15/0802 73/514.12 |
| 5,101,669 A * | 4/1992 | Holm-Kennedy | .... | G01P 5/0802 361/278 |
| 6,131,457 A * | 10/2000 | Sato | .................... | G01P 15/0885 73/514.31 |
| 6,555,404 B1 * | 4/2003 | Kubena | ................ | B81C 1/0015 257/417 |
| 6,891,988 B2 * | 5/2005 | Chaparala | ....................... | 385/16 |
| 7,233,142 B1 * | 6/2007 | Edelstein | ..................... | 324/235 |
| 7,812,336 B2 * | 10/2010 | Gabara | .............. | H01L 21/6833 257/9 |
| 7,839,605 B2 * | 11/2010 | Parker | .......................... | 360/318 |
| 7,989,248 B2 * | 8/2011 | Kumar et al. | ................... | 438/51 |
| 8,207,004 B2 * | 6/2012 | Chen | .................. | B81C 1/00238 257/E21.499 |
| 8,409,415 B2 * | 4/2013 | Liu et al. | ....................... | 204/547 |
| 8,569,090 B2 * | 10/2013 | Taheri | ............................. | 438/51 |
| 2007/0209437 A1 * | 9/2007 | Xue | ...................... | B81B 3/0032 73/514.31 |
| 2010/0170341 A1 * | 7/2010 | Dwyer | ................ | G01P 15/0802 73/514.31 |
| 2010/0283456 A1 * | 11/2010 | Zieren | ..................... | H01L 23/57 324/244 |
| 2012/0026658 A1 * | 2/2012 | Yoshimatsu | ............. | H04N 5/64 361/679.01 |

(Continued)

*Primary Examiner* — Mary Wilczewski
(74) *Attorney, Agent, or Firm* — Treasure IP Group, LLC

(57) ABSTRACT

A MEMS gyro is provided, having a movable portion, a non-movable portion, and a magnetic sensing structure that comprises a magnetic source disposed at the movable portion, a magnetic sensing element positioned at the non-movable portion. The movable portion is capable of moving in response to external angular velocity or an external accelerator such that the magnetic field sensed by the magnetic sensing element is in relation to the movement of the movable portion, therefore, the angular velocity or the accelerator. A method of making the MEMS gyro device is disclosed herein.

12 Claims, 5 Drawing Sheets

(56) References Cited

U.S. PATENT DOCUMENTS

| | | | | |
|---|---|---|---|---|
| 2013/0002244 A1* | 1/2013 | Quevy | | 324/244 |
| 2014/0026658 A1* | 1/2014 | Zhang | | B81B 5/00 73/504.12 |
| 2014/0026660 A1* | 1/2014 | Zhang | | B81B 5/00 73/504.12 |
| 2014/0026661 A1* | 1/2014 | Zhang | | B81B 5/00 73/504.12 |
| 2014/0190257 A1* | 7/2014 | Zhang | | B81B 5/00 73/504.12 |
| 2014/0308757 A1* | 10/2014 | Ju | | B81B 3/0032 438/3 |
| 2015/0033853 A1* | 2/2015 | Zhang | | G01P 15/14 73/504.12 |
| 2015/0033854 A1* | 2/2015 | Zhang | | B81B 5/00 73/504.12 |
| 2015/0033855 A1* | 2/2015 | Zhang | | B81B 5/00 73/504.12 |
| 2015/0033856 A1* | 2/2015 | Zhang | | B81B 5/00 73/504.12 |
| 2015/0034620 A1* | 2/2015 | Zhang | | B81B 5/00 219/148 |
| 2015/0226555 A1* | 8/2015 | Zhang | | B81B 5/00 73/504.12 |

* cited by examiner

METHOD OF MAKING A MEMS GYROSCOPE HAVING A MAGNETIC SOURCE AND A MAGNETIC SENSING MECHANISM

CROSS-REFERENCE

This US utility patent application claims priority from co-pending US utility patent application "A HYBRID MEMS DEVICE," Ser. No. 13/559,625 filed Jul. 27, 2012, which claims priority from U.S. provisional patent application "A HYBRID MEMS DEVICE," filed May 31, 2012, Ser. No. 61/653,408 to Biao Zhang and Tao Ju. This US utility patent application also claims priority from co-pending U.S. utility patent application "A MEMS DEVICE," Ser. No. 13/854,972 filed Apr. 2, 2013 to the same inventor of this US utility patent application, the subject matter of each of which is incorporated herein by reference in its entirety.

TECHNICAL FIELD OF THE DISCLOSURE

The technical field of the examples to be disclosed in the following sections is related generally to the art of microstructure, and, more particularly, to MEMS devices comprising MEMS mechanical moving structures and MEMS magnetic sensing structures.

BACKGROUND OF THE DISCLOSURE

Microstructures, such as microelectromechanical (hereafter MEMS) devices (e.g. accelerometers, DC relay and RF switches, optical cross connects and optical switches, microlenses, reflectors and beam splitters, filters, oscillators and antenna system components, variable capacitors and inductors, switched banks of filters, resonant comb-drives and resonant beams, and micromirror arrays for direct view and projection displays) have many applications in basic signal transduction. For example, a MEMS gyroscope measures angular rate.

A gyroscope (hereafter "gyro" or "gyroscope") is based on the Coriolis effect as diagrammatically illustrated in FIG. 1. Proof-mass 100 is moving with velocity $V_d$. Under external angular velocity $\Omega$, the Coriolis effect causes movement of the poof-mass (100) with velocity $V_s$. With fixed $V_d$, the external angular velocity can be measured from $V_d$. A typical example based on the theory shown in FIG. 1 is capacitive MEMS gyroscope, as diagrammatically illustrated in FIG. 2.

The MEMS gyro is a typical capacitive MEMS gyro, which has been widely studied. Regardless of various structural variations, the capacitive MEMS gyro in FIG. 2 includes the very basic theory based on which all other variations are built. In this typical structure, capacitive MEMS gyro 102 is comprised of proof-mass 100, driving mode 104, and sensing mode 102. The driving mode (104) causes the proof-mass (100) to move in a predefined direction, and such movement is often in a form of resonance vibration. Under external angular rotation, the proof-mass (100) also moves along the $V_s$ direction with velocity $V_s$. Such movement of $V_s$ is detected by the capacitor structure of the sensing mode (102). Both of the driving and sensing modes use capacitive structures, whereas the capacitive structure of the driving mode changes the overlaps of the capacitors, and the capacitive structure of the sensing mode changes the gaps of the capacitors.

Current capacitive MEMS gyros, however, are hard to achieve submicro-g/rtHz because the capacitance between sensing electrodes decreases with the miniaturization of the movable structure of the sensing element and the impact of the stray and parasitic capacitance increase at the same time, even with large and high aspect ratio proof-masses.

Therefore, what is desired is a MEMS device capable of sensing angular velocities.

SUMMARY OF THE DISCLOSURE

A method of making a MEMS device, wherein the MEMS device comprises a movable proof-mass, a magnetic driving mechanism, a magnetic sensing mechanism, the method comprising:
    providing a mass substrate and a sensing substrate;
    processing the mass substrate, comprising:
        forming a pillar in the mass substrate; and
        forming a magnetic source on the mass substrate;
        bonding the mass substrate and sensing substrate to form a substrate assembly;
        patterning the mass substrate of the substrate assembly to form the proof-mass and the magnetic driving mechanism; and
        cutting the substrate assembly to forming the MEMS device.

A method of making a MEMS device, wherein the MEMS device comprises a movable proof-mass, a magnetic driving mechanism, a magnetic sensing mechanism, the method comprising:
    providing a mass substrate and a sensing substrate;
    processing the mass substrate, comprising:
        forming a pillar in the mass substrate;
        forming a magnetic source on the mass substrate; and
        patterning the mass substrate of the substrate assembly to form the proof-mass and the magnetic driving mechanism;
    bonding the mass substrate and sensing substrate to form a substrate assembly; and cutting the substrate assembly to forming the MEMS device.

A method of making a MEMS device, wherein the MEMS device comprises a movable proof-mass, a magnetic driving mechanism, a magnetic sensing mechanism, the method comprising:
    providing a first wafer and a second wafer, wherein the first wafer comprises a plurality of sensing substrate dies and the second wafer comprises a plurality of mass substrate dies;
    processing the mass dies of the second wafer, comprising:
        forming a pillar in a mass die; and
        forming a magnetic source on a mass die;
    bonding the first and second wafers to form a wafer assembly;
    patterning the mass dies of the second wafer to form the proof-mass, and the magnetic driving mechanism; and
    cutting the wafer assembly to forming the MEMS device.

DETAILED DESCRIPTION OF SELECTED EXAMPLES

Disclosed herein is a MEMS gyro that utilizes a magnetic sensing mechanism for sensing the movement of the proof-mass. It will be appreciated by those skilled in the art that the following discussion is for demonstration purposes, and should not be interpreted as a limitation. Many other variations within the scope of the following disclosure are also applicable.

Figure 1:
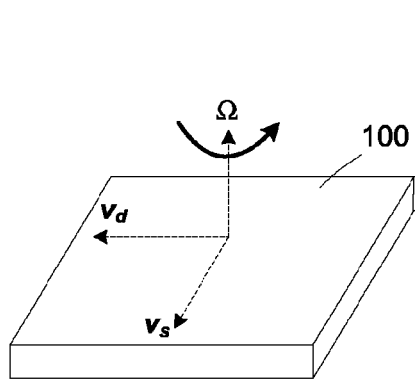
FIG. 1 diagrammatically illustrates the Coriolis effect in a MEMS structure.
Figure 2:
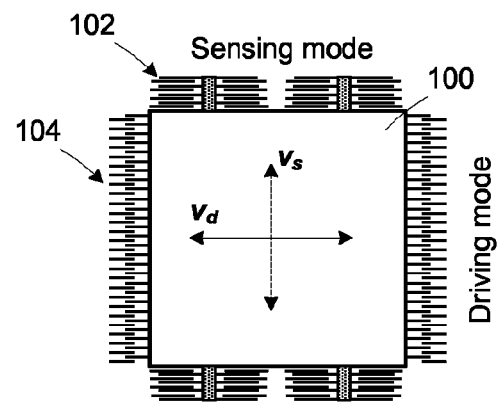
FIG. 2 is a top view of a typical existing capacitive MEMS gyroscope having a driving mode and a sensing mode, wherein both of the driving and sensing mode utilize capacitance structures.
Figure 3:
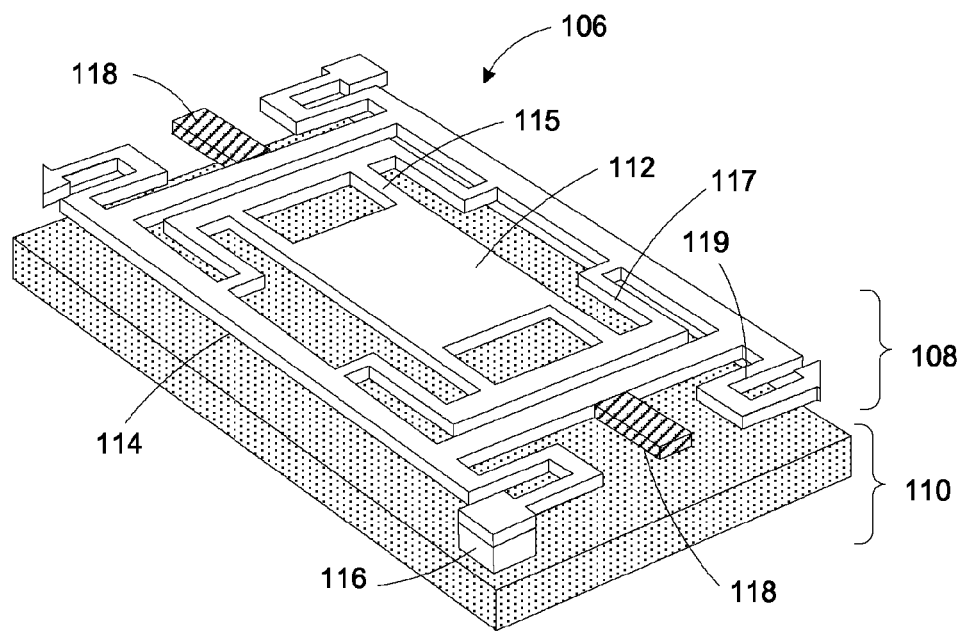
FIG. 3 diagrammatically illustrates a perspective view of an exemplary gyroscope MEMS device of this application.

Referring to FIG. 3, an exemplary MEMS gyro of this disclosure is schematically illustrated herein. MEMS gyro 106 comprises mass substrate 108 and sensing substrate 110. The mass substrate (108) comprises a movable proof-mass (112) that is supported by flexible structures such as flexures 115, 117, and 119. The layout of the flexures enables the proof-mass to move in a plane substantially parallel to the major planes of mass substrate 108. In particular, the flexures enables the proof-mass to move along the length and the width directions, wherein the length direction can be the driving mode direction and the width direction can be the sensing mode direction of the MEMS gyro device. The proof-mass (112) is connected to frame 114 through flexures (115, 117, and 119). The frame (114) is anchored by non-movable structures such as pillar 116. The mass-substrate (108) and sensing substrate 110 are spaced apart by the pillar (116).

The proof-mass (112) can be driving by a magnetic driving mechanism (118). Specifically, the proof-mass (112) can move (e.g. vibrate) in the driving mode under magnetic force applied by magnetic driving mechanism 118, which will be detailed afterwards with reference to FIG. 5.

It is noted that the MEMS gyro device 106 in FIG. 3 is an example and for demonstration purpose. Other variations are also applicable. For example, the proof-mass, frame, flexures, and the magnetic driving mechanism can have different variations and implemented in many different ways. Specifically, the magnetic driving mechanism (118) in this example shown in FIG. 3 is attached to frame 114. In other examples and implementations, the magnetic driving mechanism (118) can be implemented in different ways, such as attached directly or even embedded inside the proof-mass (112).

Figure 4:
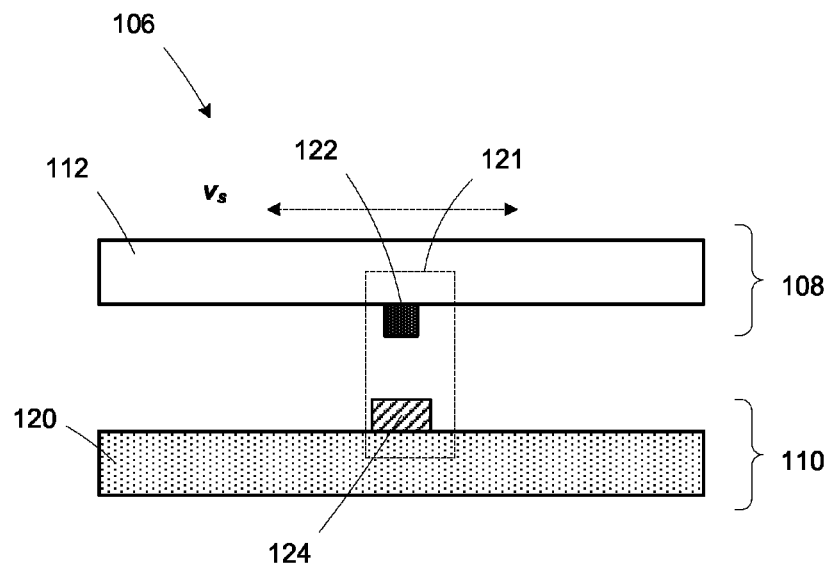
FIG. 4 illustrates a side view of the gyroscope MEMS device shown in FIG. 3.

A side view of the MEMS gyro device (106) is illustrated in FIG. 4. Referring to FIG. 4, mass substrate 108 comprises proof-mass 112 and sensing substrate 110 comprises substrate 120. The mass substrate and the sensing substrate are spaced apart, for example by pillars that are not shown herein for simplicity. For sensing the movement of the proof-mass (112) in the sensing mode, so as to detect the target angular velocity, a magnetic sensing mechanism 121 is provided. In this example, the magnetic sensing mechanism 121 comprises magnetic source 122 and magnetic field sensor 124. The magnetic source 122 can be attached to the proof-mass 112 and moves with the proof-mass 112. The magnetic field sensor 124 is placed on substrate 120 and in the vicinity of the magnetic source 122.

In operation, the magnetic source 122 moves with the proof-mass 112. The magnetic field from the magnetic source changes with the movement of the magnetic source at the location of the magnetic sensor 124. By detecting and analyzing the magnetic field detected by the magnetic sensor 124, the movement of the magnetic source 122 and thus the movement of the proof-mass 112 can be obtained.

In an exemplary operation, the proof-mass 112 moves, e.g. along the X direction, in the driving mode, while the XY plane is in the plane of the mass substrate 108. The magnetic field from the magnetic source 122 changes at the location of the magnetic sensor 124. This change can be recorded as a background magnetic field, which is referred to as the "driving mode magnetic field." In the existence of an angular velocity along Z direction (perpendicular to the XY-plane), the proof-mass 112 moves along the Y direction. The movement of the proof-mass along the Y direction causes a variation of the magnetic field at the location of the magnetic sensor 124, and such magnetic field is referred to as the "sensing mode magnetic field," which includes the "driving mode magnetic field." By viewing the "driving mode magnetic field" as a background, sensing mode magnetic field can be extracted. The movement of the proof-mass, and thus the angular velocity along Z direction can be obtained.

Figure 5:
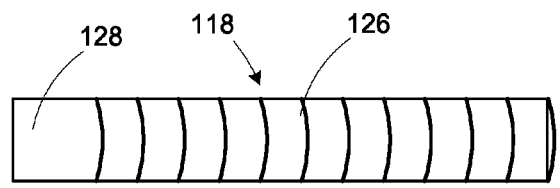
FIG. 5 illustrates an example of the magnetic driving mechanism of the MEMS device shown in FIG. 3.

In the driving mode, the proof-mass moves under a magnetic force from the magnetic driving mechanism 118 as shown in FIG. 3. The magnetic driving mechanism can be implemented in many different ways, one of which is illustrated in FIG. 5. Referring to FIG. 5, the magnetic driving mechanism 118 comprise a magnet core 128 surrounded by coil 126. By applying an alternating current through coil 126, an alternating magnetic field can be generated from the coil 126. The alternating magnetic field applies magnetic force to the magnet core 128 so as to move the magnet core. The magnet core thus moves the proof-mass (112).

It is noted that the magnetic driving mechanism 118 as illustrated in FIG. 5 is an example and for demonstration purpose. It should not be interpreted as a limitation. Other variations within the scope are also applicable. For example, the magnet core can be attached directly or non-directly to the proof-mass so as to move along with the proof-mass, while the coil can be attached to a fixed portion that is "not movable" relative to the moving proof-mass. Alternatively, the coil can be attached directly or non-directly to the moving proof-mass, while the magnet core is non-movable relative to the moving proof-mass. In yet another example, the magnet core 128 can be replaced by a coil that is coupled to a current source such that current can be applied to the coil. When two coils are applied with current along different directions, magnetic fields with opposite directions can be generated. The coils are expelled to each other under such magnetic fields with opposite directions. When the coils are applied with current along the same direction, magnetic fields with the same direction can be generated. The two coils are attracted to each other under such magnetic fields.

Figure 6:
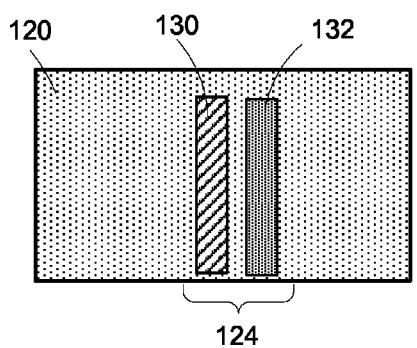
FIG. 6 illustrates a top view of the bottom substrate having a pair of magnetic field sensing elements of the MEMS device of FIG. 3.

Sensing substrate 110 of FIG. 4 comprises a magnetic field sensor 124, which is better illustrated in a top view as shown in FIG. 6. Referring to FIG. 6, substrate 120 of the sensing substrate (110) comprises magnetic sensor 124. In this example, magnetic sensor 124 comprises a signal sensor 130 and a reference sensor 132. The signal sensor can be used for sensing the target magnetic field, while reference sensor 132 can be used for detecting the background or environmental magnetic signals. The outputs of the signal sensor 130 and reference sensor 132 can be subtracted so as to extract the target magnetic field. In one example, the reference sensor 132 and signal sensor 130 can be connected to a Wheatstone Bridge, which is not shown herein because Wheatstone bridge is well known in the art. Of course, reference sensor 132 may not be necessary in other exemplary implementations. In some other examples, multiple signal sensors can be provided for detecting different modes. For example, a signal sensor (or a reference sensor) can be provided for detecting the magnetic field from the proof-mass in the driving mode, while another signal sensor can be provided for detecting the magnetic field from the proof-mass in the sensing mode. In examples while the magnetic sensors comprise magneto-resistors, such as AMR, GMR, Spin-valve, and Magnetic-Tunnel-Junction (or Tunneling-Magneto-Resistor, TMR), the signal sensor (or the reference sensor) from the driving mode and the signal sensor for the sensing mode can be align perpendicularly, such as the easy-axes (e.g. the length) of the sensors in the driving and sensing modes are substantially perpendicular in the plane of the sensing substrate (110).

Figure 7:
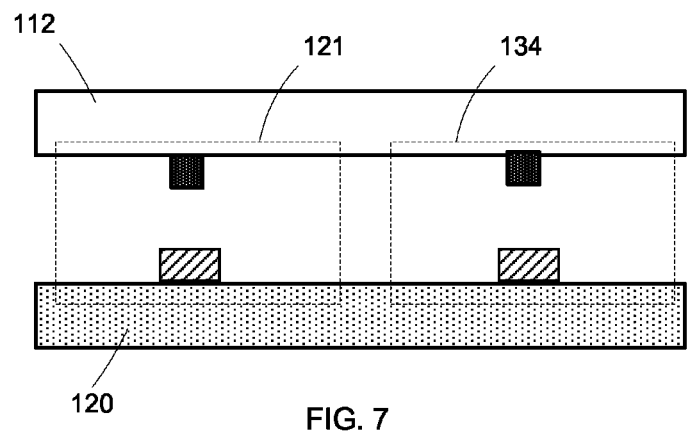
FIG. 7 illustrates another example of a MEMS device of this application.

In some applications, multiple magnetic sensing mechanisms can be provided, an example of which is illustrated in FIG. 7. Referring to FIG. 7, magnetic sensing mechanisms 121 and 134 are provided for detecting the movements of proof-mass 112. The multiple magnetic sensing mechanisms can be used for detecting the movements of proof-mass 112 in driving mode and sensing mode respectively. Alternatively, the multiple magnetic sensing mechanisms 121 and 134 can be provided for detecting the same modes (e.g. the driving mode and/or the sensing mode).

The MEMS gyroscope devices discussed above can be fabricated in various ways. For demonstration purpose, FIG. 8a through FIG. 8f illustrates an exemplary method of making the MEMS gyroscope device as shown in FIG. 3.

Figure 8A:
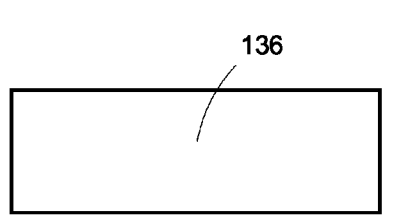
FIG. 8a through FIG. 8f is a block flow diagram showing an exemplary process that can be used for making the MEMS device shown in FIG. 3.
Figure 8B:
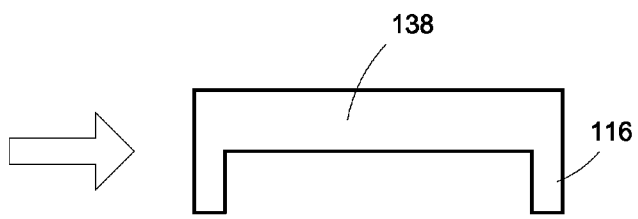
Figure 8D:
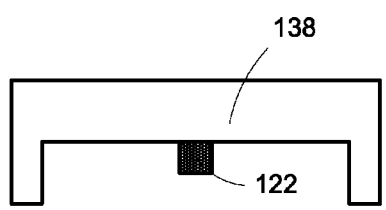
Figure 8C:
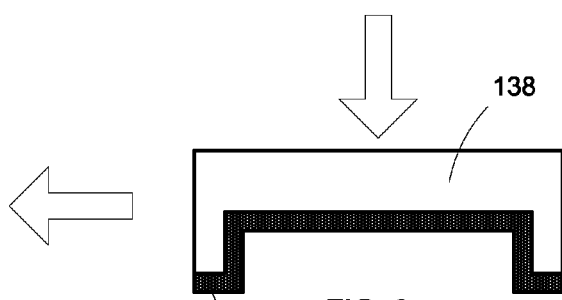

Referring to FIG. 8a, substrate 136 is provided for making the mass substrate (112). Substrate 136 is patterned to form pillars (116) as shown in FIG. 8b. The patterning can be accomplished through many suitable ways, such as wet etching, dry etching and other methods. The etched substrate 138 is deposited with a layer (139) for the magnetic source. In an example wherein the magnetic source is a conducting wire, layer 139 comprised of a conducting material, such as aluminum, copper or other materials is deposited by a film deposition method, such as a spin-on, PVD, CVD, or other suitable methods, as shown in FIG. 8c. The deposited magnetic source layer 139 is then patterned, for example, by photolithography process, to form desired magnetic source 122 as illustrated in FIG. 8d.

Figure 8E:
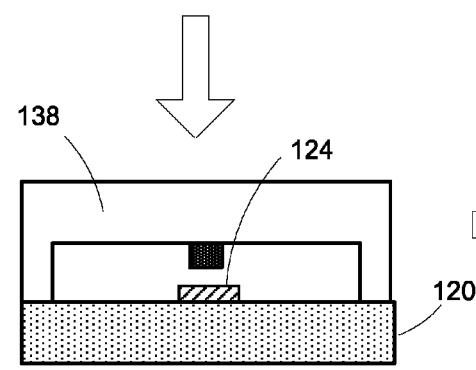

The mass substrate (138) with the formed pillars and magnetic source(s) can be assembled with substrate 120 having magnetic sensor 124 formed thereon as illustrated in FIG. 8e. The assembling can be accomplished by a suitable wafer bonding technique, such as anodic bonding, surface bonding or other methods.

Figure 8F:
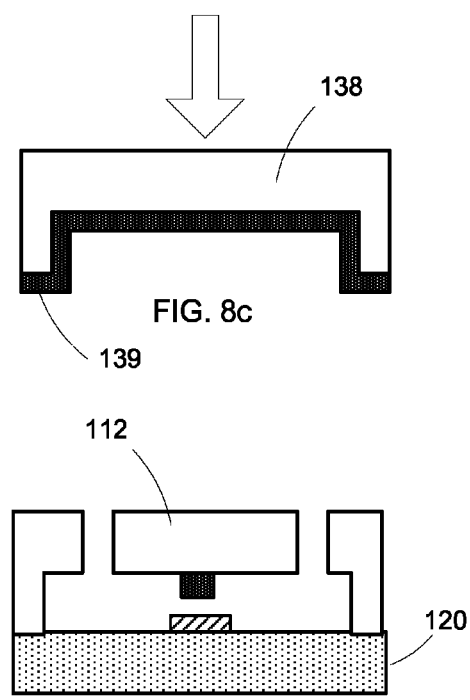

The assembly can go through a patterning process to form the desired features, such as proof-mass 112, flexures, frames on the mass substrate. The patterning can be accomplished by, for example, ion-etching, reactive ion-etching, deep reactive ion-etching or other suitable methods, as illustrated in FIG. 8f.

Other than forming a substrate assembly followed by patterning the mass substrate, the mass substrate can be patterned before substrate assembly, an exemplary process of which is illustrated in FIG. 9a through FIG. 9f.

Figure 9A:
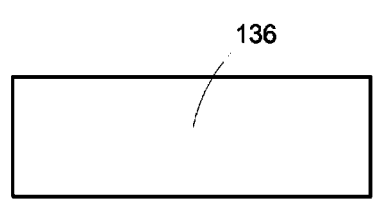
FIG. 9a through FIG. 9f is a block flow diagram showing another exemplary process that can be used for making the MEMS device shown in FIG. 3.
Figure 9B:
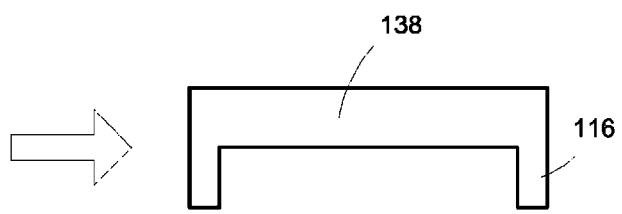
Figure 9D:
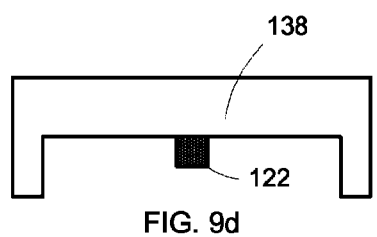
Figure 9C:
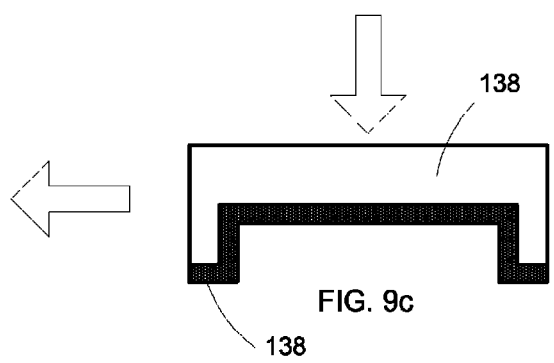
Figure 9E:
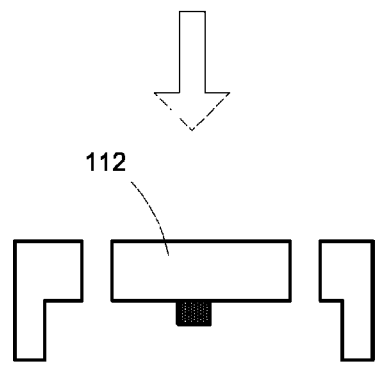
Figure 9F:
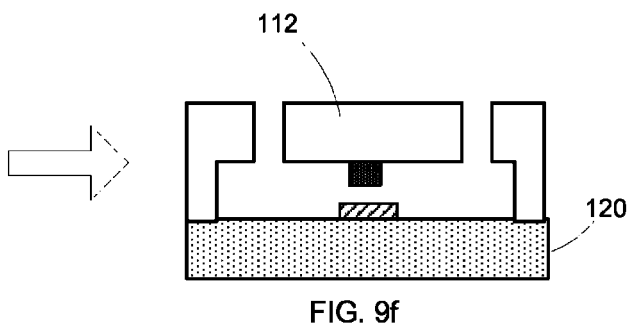

Referring to FIG. 9a, substrate 136 is provided. Substrate 138 is patterned to form pillars (116) as shown in FIG. 9b. Layer 138 for forming the magnetic source is deposited as illustrated in FIG. 9c; and the layer 138 is patterned to form the desired magnetic source 122 as illustrated in FIG. 9d. The substrate 138 is patterned to form the desired features such as proof-mass 112, flexures, frames as illustrated in FIG. 9e. The patterned substrate 138 can be assembled with substrate 120 having magnetic sensor formed thereon, as illustrated in FIG. 9f.

Figure 10A:
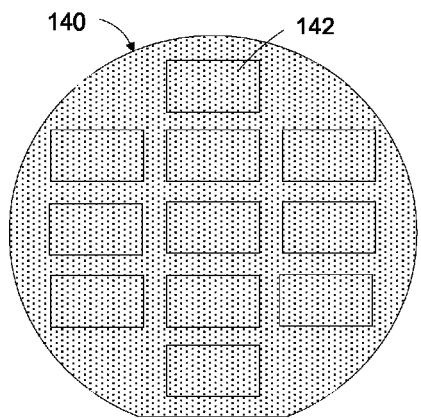
FIG. 10a through FIG. 10c show a wafer level method that can be used for making the MEMS device of FIG. 3.
Figure 10B:
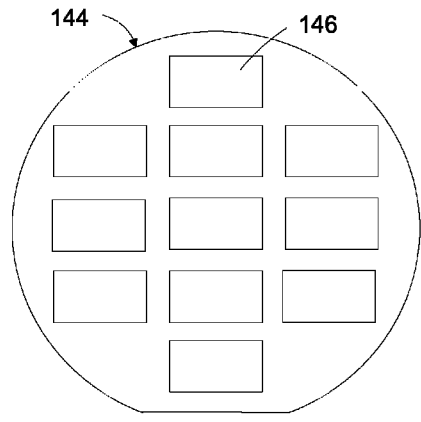
Figure 10C:
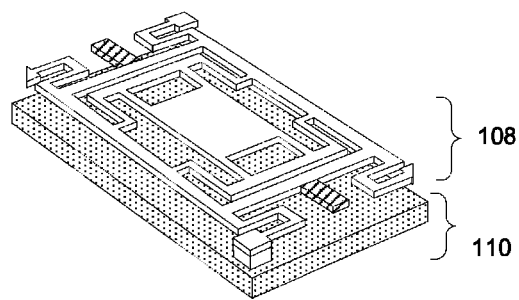

The fabrication methods as discussed above, as well as their variations within the scope can be accomplished on the device level, or can be accomplished on the wafer level, an example of which is illustrated in FIG. 10a through FIG. 10c. Referring to FIG. 10a, wafer 140 is provided. Multiple dies, such as die 142, are formed in wafer 140 for forming sensing substrate 110. As illustrated in FIG. 10b, wafer 144 is provided for making mass substrate 108. Wafer 144 has multiple dies, such as die 146 formed thereon. Wafers 140 and 144 can then be processed according to a desired fabrication process, such as those discussed above with reference to FIG. 8a through FIG. 8f and FIG. 9a through FIG. 9f. With reference to the method discussed above with reference to FIG. 8a through FIG. 8f, wafer 144 can be processed to form pillars and magnetic sources in dies 146. Magnetic field sensors are formed on or in dies (e.g. 142) of wafer 140. Wafer 144 and wafer 140 can be assembled so as to form wafer assembly with dies in wafer 144 are aligned to the dies of wafer 140. Wafer 144 of the wafer assembly can be patterned so as to form proof-mass, flexures, frames, magnetic driving mechanisms. After patterning, the wafer assembly can be cut so as to form separate devices, as shown in FIG. 10c.

Similar to the method of making as discussed above with reference to FIG. 9a through FIG. 9f, wafer 140 and 144 can be processed separately followed by wafer bonding. Specifically, wafer 140 can be processed to form magnetic sensors in dies (142) thereon. Wafer 144 can be processed to form the desired magnetic source and patterned to form the desired features, such as proof-masses, flexures, frames and other features in dies 146. The processed and patterned wafer 144 can be bonded to wafer 140 to form a wafer assembly. The wafer assembly can be cut to obtain separate devices, such as that illustrated in FIG. 10c.

It will be appreciated by those of skilled in the art that a new and useful MEMS gyroscope has been described herein. In view of the many possible embodiments, however, it should be recognized that the embodiments described herein with respect to the drawing figures are meant to be illustrative only and should not be taken as limiting the scope of what is claimed. Those of skill in the art will recognize that the illustrated embodiments can be modified in arrangement and detail. Therefore, the devices and methods as described herein contemplate all such embodiments as may come within the scope of the following claims and equivalents thereof. In the claims, only elements denoted by the words "means for" are intended to be interpreted as means plus function claims under 35 U.S.C. §112, the sixth paragraph.

I claim:

1. A method of making a MEMS device, wherein the MEMS device comprises a movable proof-mass, a magnetic driving mechanism, a magnetic sensing mechanism, the method comprising:
   providing a mass substrate and a sensing substrate;
   processing the mass substrate, comprising:
      forming a pillar in the mass substrate; and
      forming a magnetic source on a portion of the mass substrate, wherein said portion of the mass substrate is to be formed into the movable proof-mass;

bonding the mass substrate and sensing substrate to form a substrate assembly;

patterning the mass substrate of the substrate assembly to form the movable proof-mass and the magnetic driving mechanism, wherein said magnetic source is on the formed movable proof-mass; and cutting the substrate assembly to forming the MEMS device.

2. The method of claim 1, wherein the magnetic source comprises a segment of a conducting wire.

3. The method of claim 1, wherein the magnetic source comprises a magnetic nano-particle.

4. The method of claim 1, further comprising:

forming the magnetic sensing mechanism on the sensing substrate before bonding the sensing substrate and mass substrate.

5. The method of claim 4, wherein the magnetic sensing mechanism comprises a magneto-resistor.

6. The method of claim 5, wherein the magneto-resistor comprises a spin-valve or a tunneling-magneto-resistor.

7. A method of making a MEMS device, wherein the MEMS device comprises a movable proof-mass, a magnetic driving mechanism, a magnetic sensing mechanism, the method comprising:

providing a first wafer and a second wafer, wherein the first wafer comprises a plurality of sensing substrate dies and the second wafer comprises a plurality of mass substrate dies;

processing the mass substrate dies of the second wafer, comprising:

forming a pillar in a mass substrate die; and forming a magnetic source on a portion of mass substrate die, wherein said portion of the mass substrate die is to be formed into a movable proof-mass;

bonding the first and second wafers to form a wafer assembly;

patterning the mass substrate dies of the second wafer to form the movable proof-masses, and the magnetic driving mechanism, wherein the magnetic source is on the formed movable proof-mass; and cutting the wafer assembly to forming the MEMS device.

8. The method of claim 7, wherein the magnetic source comprises a conducting wire.

9. The method of claim 7, wherein the magnetic source comprises a magnetic nano-particle.

10. The method of claim 7, further comprising:

forming the magnetic sending mechanism on the sensing substrate dies of the first wafer before bonding the first and second wafers.

11. The method of claim 10, wherein the magnetic sensing mechanism comprises a magneto-resistor.

12. The method of claim 11, wherein the magneto-resistor comprises a spin-valve or a tunneling-magneto-resistor.

\* \* \* \* \*